Dec. 16, 1952 J. R. HARRIS 2,622,213

TRANSISTOR CIRCUIT FOR PULSE AMPLIFIER DELAY AND THE LIKE

Filed Sept. 19, 1951 2 SHEETS—SHEET 1

INVENTOR
J. R. HARRIS
BY H. A. Burgess
ATTORNEY

INVENTOR
J. R. HARRIS
BY H. A. Burgess
ATTORNEY

Patented Dec. 16, 1952 2,622,213

UNITED STATES PATENT OFFICE 2,622,213

TRANSISTOR CIRCUIT FOR PULSE AMPLIFIER DELAY AND THE LIKE

James R. Harris, Dover, N. J., assignor to Bell Telephone Laboratories, Incorporated, New York, N. Y., a corporation of New York Application September 19, 1951, Serial No. 247,349

12 Claims. (Cl. 307—88)

This invention relates to novel transistor circuits which may be used, for example, as pulse amplifier-delay circuits.

The circuits of the present invention all utilize transistors which are characterized by current multiplication factors of greater than unity. An example of this type of transistor is the type A, or point contact transistor, which is described, for example, in Patent No. 2,524,035, granted October 3, 1950, to John Bardeen and Walter H. Brattain. Transistors of this type comprise a body of semiconductive material, such as germanium or silicon, with which a pair of electrodes, known as the emitter and collector electrodes, make rectifier point contact and with which a third electrode, known as the base electrode, makes a low resistance contact. If the semiconductive body is composed of n-type material, the emitter electrode is, in small signal circuits, generally biased in its low resistance or forward direction by a small positive voltage which is applied to the emitter, while a relatively large negative voltage is applied to the collector electrode to bias the latter in its high resistance or backward direction. Assuming electrode currents to be positive if they flow from the electrode into the semiconductive body, the emitter current will normally be positive and the collector current negative in this type of circuit. If the semiconductive body is composed of p-type material, the polarities of the voltages and the directions of the actual currents used will be the reverse of those just mentioned. With nearly all transistors of this type, incremental changes in the emitter current in the active region will result in even larger changes in the collector current. This current amplification is generally considered in terms of $\alpha$, a dimensionless factor equal to $$-\left[\frac{\partial I_c}{\partial I_e}\right] V_c = \text{constant}$$

the minus signs resulting from the different directions of emitter and collector current flow. As an approximation, $\alpha$ is equal to $$\frac{r_m}{r_c}$$

where $r_m$ is the equivalent mutual resistance of the transistor and $r_c$ is the equivalent collector resistance.

The present invention will be described in terms of circuits which employ n-type point contact transistors, although it should be understood that the invention is equally applicable to p-type point contact, p—n junction, n—p—n junction, p—n—p junction, or any other type of transistor, so long as the phenomena of current multiplication are displayed between at least two electrodes of the transistor.

In an illustrative embodiment of the invention which is described in more detail below, the base electrode of a current multiplication transistor is isolated from the emitter and collector electrodes for direct currents by a condenser which is common to the external circuits interconnecting the base and emitter and base and collector electrodes, respectively. A third circuit interconnecting the emitter and collector electrodes is defined by the two circuits just mentioned and includes a source of direct current, the usual collector supply. The transistor circuit thus far described has just one state of stable equilibrium. When disturbed from this state, it goes through a useful cycle and then returns to its previous condition. The circuit may therefore be termed monostable. In equilibrium, the device is saturated, that is, it is operating beyond the knee of the collector-voltage versus collector-current characteristic. Current and voltage values in this state are readily determined from the static characteristic curves of the device. If currents are momentarily low so that the device is in its active region, i. e., below the knee, then, due to the current amplification properties of the transistor, the transistor will rapidly saturate; and the circuit will adjust itself so that the emitter current becomes equal to the collector current. This equilibrium condition will exist until the emitter current is cut off, for example, by a positive pulse which is applied to the base electrode through the above-mentioned condenser. Even though this positive pulse is held, the base terminal of the condenser will begin to drift toward the potential of the collector supply, and when the base potential reaches a critical value near the emitter potential, going negative, the circuit will return very rapidly to the saturated state. The circuit will also return to the saturated state any time the positive input pulse is removed.

A feature of the circuit just described is that it always tends toward the saturated state regardless of direct-current levels and will compensate for changes in the direct-current level of the trigger signal. The circuit will therefore trigger successively with an input stairstep wave.

An object of the invention is an improved circuit which will deliver a strong voltage step of the desired polarity after a predetermined delay.

Another object of the invention is an improved pulse amplifier-delay circuit capable of delivering a powerful output pulse at the proper time.

Other objects of the invention relate to improved transistor circuits which will deliver properly poled voltage steps of high power to an output circuit after a given delay from an input pulse and having desired circuit characteristics.

The invention, its objects, and features may be more fully understood from a consideration of the following detailed description when read in accordance with the attached drawings, in which.

Figure 1:
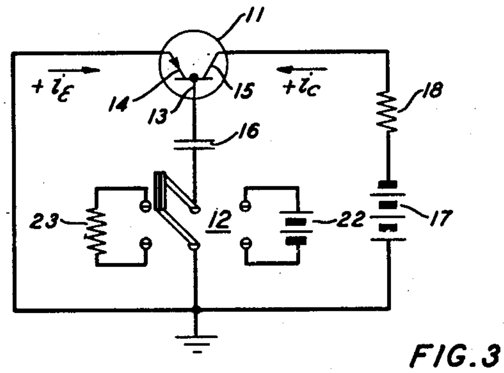
Fig. 1 is a schematic diagram showing a transistor circuit employing principles of the present invention.
Figure 3:
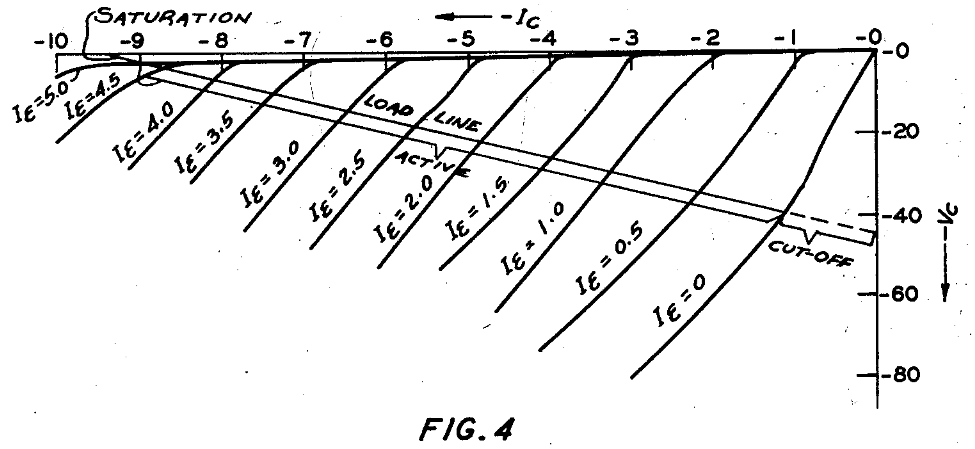
Fig. 3 shows static characteristic curves of an illustrative transistor.

The transistor in Fig. 1 is assumed to be a point contact n-type transistor with positive emitter and negative collector currents $i_e$ and $i_c$ flowing. Static collector voltage versus collector current characteristics for a typical transistor of the type are shown in Fig. 3. (Other static characteristics are shown in an article entitled, "Some Circuit Aspects of the Transistor," by R. M. Ryder and R. J. Kircher, which appears in the Bell System Technical Journal, vol. 28, July 1949.) A static load line for a collector supply voltage of —45 volts and a collector resistor of 4700 ohms is also shown. It is assumed that the emitter to base voltage in active and saturated regions is very small for purposes of drawing this load line. These characteristics may be divided into three regions, the "active" region, the "cut-off" region, and the saturation region; these regions are indicated adjacent the load line in Fig. 3. The active region has intermediate values of voltage and current and is capable of giving gain. In the devices considered herein, there can be current gain in addition to voltage gain. Further, the phase or sense of the gain is such that $\alpha$ is positive. The cut-off region is characterized by relatively low currents and high voltages and low gain. The saturation region has low gain and high currents and, generally, low voltages. It should be noted that the knees of the constant emitter current curves are located on a low voltage line so that variations of emitter current in the saturated region will effect substantially no change in collector voltage.

A device property that is important to the invention is that there shall be current gain when the emitter current is substantially zero. This property insures that the circuit will go into the saturated region even with no initial emitter current. The critical value of current gain is at $\alpha$ somewhat greater than 1, due to the fact that R reduces the "effective $\alpha$" somewhat where R is the load resistor connected in the collector circuit. It should be noted that $\alpha$ and current gain are not completely synonomous, since $\alpha$ is measured with the collector voltage held constant, while circuit current gain is dynamically determined, permitting the collector voltage to vary.

The quiescent state of the transistor 11 in the illustrative circuit shown in Fig. 1 will be in the saturated region with the switch 12 closed either to the right or to the left, assuming transient conditions to have subsided. This occurs because the base electrode 13 is isolated for direct currents from both the emitter 14 and collector 15 electrodes by the condenser 16 which is common to both the circuit interconnecting the base 13 and emitter 14 and the circuit interconnecting the base 13 and collector 15. The only direct-current path, therefore, is the circuit which interconnects the emitter and collector electrodes and which includes the collector supply battery 17 and resistor 18. In an actual circuit employing a battery voltage of 45 volts and a resistor 18 of 4700 ohms, 9 milliamperes was measured in this circuit. Resistor 18 is purposely chosen large so as to effect a substantially constant current source.

Figure 2:
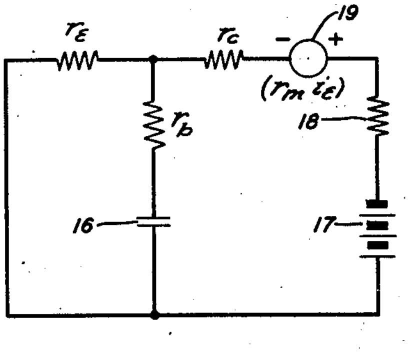
Fig. 2 shows an equivalent circuit of Fig. 1.

The transistor 11 is driven into the saturation region by its current amplification properties. A small bias current flowing into the emitter electrode will cause a slightly larger current to flow out of the collector electrode. (A small bias current will tend to flow in the emitter electrode due to the collector battery, because $r_c$ is not infinitely large in any region.) The transistor cannot remain in the active region due to the unbalance of currents in the emitter and collector electrodes and due to the regenerative nature of the circuit. It, therefore, remains quiescent in the saturated region with equal current flowing in the emitter and collector electrodes. Due to the voltage drop across the equivalent emitter resistance $r_e$, shown in the equivalent circuit in Fig. 2, the condenser 16 will acquire a charge of a volt or so. ($r_e$ is lower in the saturated region than in the active region.) $r_c$ and $r_b$ are the equivalent collector and base resistances, respectively, while the generator 19 accounts for the current amplification property by generating a voltage equal to $r_m i_e$, $r_m$ being the equivalent mutual resistance of the transistor.

If the quiescent state is disturbed, for example, by suddenly closing, the switch 12 to the right when it had previously been closed to the left so as to suddenly drive the base 13 positive with respect to the emitter 14, the forward emitter current $i_e$ will be cut off by the battery 22, which makes the base positive with respect to the emitter. With the emitter current cut off, the base terminal of the condenser 16 will drift toward a potential nearly equal to the voltage of battery 17; this action is illustrated by the wave form 20 in Fig. 4 which shows the base potential measured with respect to the emitter. When the base 13 drifts sufficiently negative with respect to the emitter, however, positive emitter current will again flow which will rapidly drive the transistor once again into the saturation region.

Figure 4:
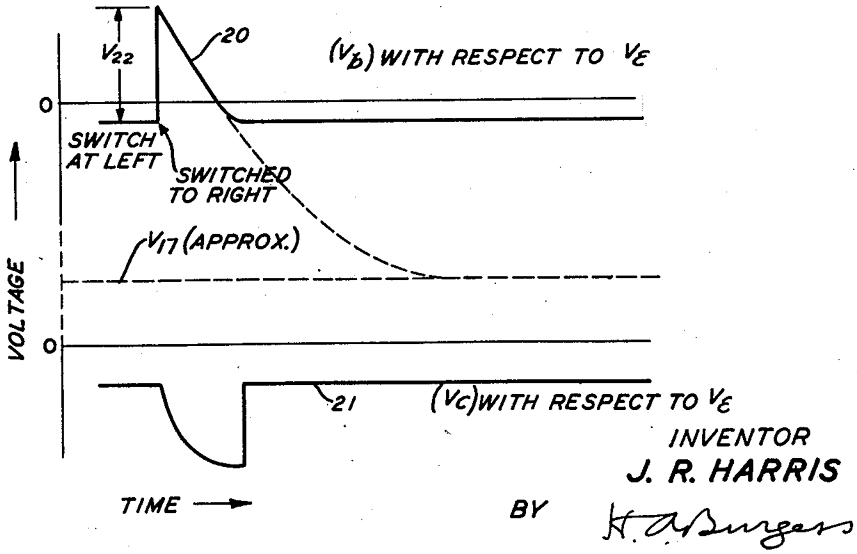
Fig. 4 shows wave forms illustrative of the present invention.

By cutting off the emitter current as just described, a voltage, as illustrated by wave form 21 in Fig. 4, will be produced at the collector. It may be noted that the collector 15 drifts negatively along with the base which should be evident from a consideration of the equivalent circuit in Fig. 2. The collector electrode, therefore, provides a logical element from which useful output may be taken, for example, directly in or from across resistor 18 or by inductive or capacitive coupling in an obvious manner.

It should be noted that the transistor returns to the saturated state at a time after the switch is closed from left to right even though the positive voltage is held in the base circuit. This makes possible successive triggering by a stairstep wave, providing there is sufficient time between steps for the circuit to adjust itself to the new direct-current trigger level. It should also be noted that the transistor will return to the saturated region if the switch were suddenly closed back to the left so as to remove the positive voltage from the base circuit.

The duration of the "off" condition is determined within the limits of the maximum "off" period by the duration of the trigger, in Fig. 1 by the length of time the switch is permitted to remain closed right. The maximum duration of the "off" condition is controlled both by the magnitude of the trigger (the voltage of battery 22 in Fig. 1) and the rate of charging of condenser 16, the latter being determined primarily by the magnitude of resistor 18 and $r_c$, condenser 16, and the voltage of battery 22. The effect of the magnitude of the trigger may be seen by referring to wave form 20 in Fig. 4.

If the transistor is in the quiescent state with the switch 12 closed to the right, this state will not be disturbed appreciably if the switch is suddenly closed left. The direct-current levels will shift slightly, but the transistor will remain saturated. Resistor 23 serves to limit the forward emitter current when the switch is suddenly closed left.

The switch 11 in Fig. 1 is merely illustrative. Other means of cutting off the emitter current so as to disturb the circuit from its quiescent state are also applicable, as will be shown.

Useful output may be obtained from the collector merely by substantially diminishing the emitter current, i. e., even though the emitter current is not reduced to zero but is merely reduced to an intermediate value in the active region.

Among the circuits with which circuits employing principles of the current invention may be employed to advantage are shift registers. Shift registers are described, for example, in an article entitled, "Digital Computors," by West and De Turk, which appears in the Proceedings of the I. R. E. for December 1948. Two stages of a shift register are shown by way of example in Fig. 4. Each stage 31 and 32 of the register comprises a one-bit register which is a two-state device capable of storing one bit of information in binary form. The registers 31 and 32 may comprise, for example, conventional bistable multivibrators ("flip-flops") or may, for example, comprise units of the type described in a copending application of A. E. Anderson and R. L. Trent, Serial No. 246,833, filed September 15, 1951. In any event, they comprise devices which assume one state to represent a "1" and another state to represent a "0," "1" and "0" being the designations for the binary information. Input terminals are provided for each register to either set it to "1" or to "0," the "1" and "0" being manifested at an output terminal by different steady voltage levels.

The problem is to change the state of the registers so that the stored information moves from left to right along the linear array of one-bit registers. This makes possible, for example, the sequential application to an output circuit of the digits of a multidigit number in order of increasing significance. There are two basic ways of accomplishing this shift. The first way is to sample the state of each register and to cause the next register to go to the state determined by the sample of this register. The second is to first set all registers to "0" and then set to "1" those registers where a "1" was previously stored in the next preceding register. The shift register illustrated in Fig. 5 employs the latter of these two methods. A programming pulse is applied to the set to "0" input of all registers through the isolation diodes 35. Those registers which were already set to "0" will produce no output pulse. Those registers which were storing a "1" will, however, produce an output pulse in going to "0"; it is this latter pulse which is employed to set the next succeeding register back to "1," thereby shifting the information to the next register stage.

The complete shift cannot be instantaneous, regardless of which of the two methods of shifting just described are used. For example, consider the register shown in Fig. 5. If both registers 31 and 32 are storing a "1," the register 32 must be permitted to go to "0" before the pulse produced by the first register 31 is applied to its input to reset it. Some delay or memory is required. Some amplification may also be desirable.

Figure 5:
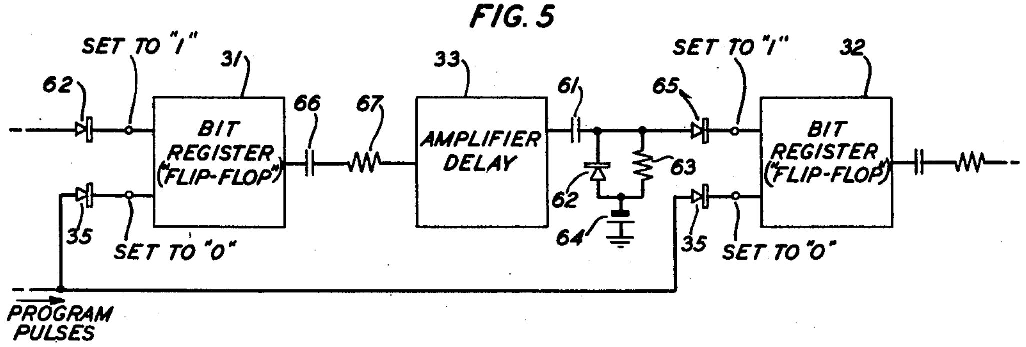
Fig. 5 is a schematic diagram of a shift register of a type with which the present invention may be utilized.
Figure 6:
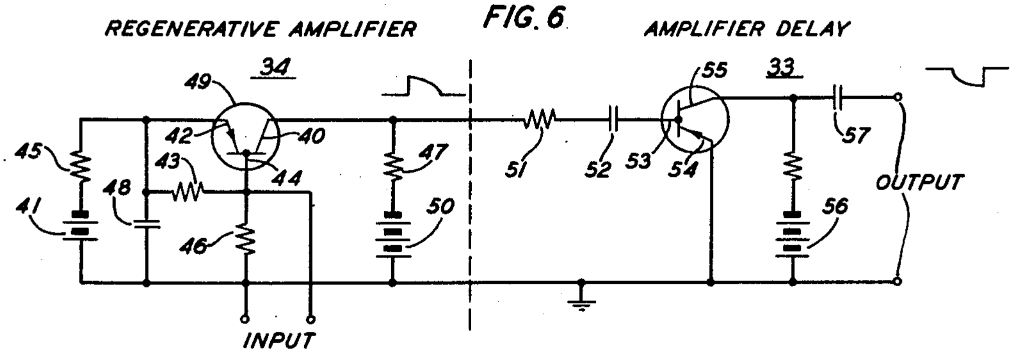
Fig. 6 is a schematic diagram of an amplifier-delay circuit which may be employed with the circuit of Fig. 5.

A suitable interstage circuit, viz., an amplifier-delay circuit 33, which may be inserted between each of the bit registers in Fig. 5, is shown in Fig. 6. This circuit includes also a regenerative amplifier 34. If the bit registers 31 and 32 of Fig. 5 comprise units of the type described in the above-described Anderson-Trent application, the voltage produced at the output terminal of the bit register when going from a "1" to a "0" can be, at the will of the designer, a negative-going pulse. This information is of such simple form ("yes" or "no") that there is no need to amplify and transmit it without change in wave form; simple regeneration (i. e., local generation in contradistinction to positive feedback) will be adequate. Also, if the duty cycle of the shift register is such that the information arrives at spaced predictable times, a regenerative amplifier will have time to acquire and store energy for a relatively large output pulse when it is triggered. The gain of such an amplifier can be made higher than that of a non-regenerating amplifier of equivalent stability.

The regenerative amplifier 34 shown in Fig. 6 has been found quite suitable for this purpose. In addition, this circuit is relatively insensitive to false triggering, due to temperature changes, etc. A circuit of this type is described in a copending application of A. E. Anderson, Serial No. 166,733, filed June 7, 1950. The regenerative amplifier in Fig. 5 is normally "off." It is held "off" by current from the large, e. g., 90 volts, negative bias supply 41 flowing through the parallel combination of the emitter 42 back resistance and the resistor 43 which shunts the emitter 42 and base 44 electrodes. The resistor 45 in series with the bias batteries is fairly large, so that the current supply is substantially constant current. This fact is important in the circuit stabilization of required trigger amplitude. The quiescent base voltage could vary, for example, from −10 to −20 volts, representing a variation of one milliampere, in collector leakage, with only a 15 per cent change in the hold-off current.

This circuit is connected to be triggered on its base. When a negative pulse of the required trigger amplitude is applied to the base electrode 44 (equivalent to driving the emitter electrode positive), the circuit will proceed into a negative resistance region promoted by the large feedback resistor 46. The "on" time is controlled by the magnitude of the base 46 and the collector resistor 47, together with the condenser 48 which shunts the emitter supply 41 and the transistor 49 (assuming no output load). When the circuit goes "on," the condenser 48 sees an approximate equivalent circuit comprising a resistance and internal voltage determined by resistors 46 and 47, and the transistor and battery 50. Current flows in the condenser 48 through the emitter 42 as the condenser tends to charge toward this internal voltage of the equivalent circuit. As the condenser 48 charges, the emitter current supply drops until it no longer will keep the transistor "on" (saturated). As the transistor starts to go "off," the base 44 becomes more positive, accelerating the going-off.

Immediately after going off, the emitter electrode is quite negative, the condenser 48 having been charged during the "on" time by the negative emitter supply 41. The circuit is thus insensitive at this time to spurious voltages appearing at either the input or output. The emitter, however, drifts positive as the condenser 48 discharges, most of the discharge current flowing through the shunt resistor 43. A low value for this resistor gives a quicker recovery, the recovery time being also dependent on the amplitude of the trigger pulse.

A positive step voltage on the input does not trigger the circuit but causes it to stabilize with reference to the new, more positive input voltage. After it stabilizes, the circuit is again fully sensitive to a negative step, this time referred to the input voltage at which it stabilizes. A series of negative steps, stairstep fashion, each going further negative, will trigger the circuit again and again, provided the steps are far enough apart to allow the circuit to recover, provided also the process is not carried too far.

It may be noted that the circuit is relatively insensitive to slowly varying input pulses. If the input to the base changes slowly, the emitter potential will follow the base potential, giving little or no emitter 42 to base 44 voltage which is necessary to trigger the circuit. "Fast" or "slow" is measured against the time constant of the emitter to base resistance and the capacitance of condenser 48.

When a step voltage occurs in the output of a two-state circuit, the output can sometimes be represented by a simple equivalent circuit before the step, and a different simple equivalent circuit after the step. In the present case when the regenerative amplifier 34 is "off," there is looking into the collector terminal 40 a resistance on the order of 3500 ohms and an internal voltage on the order of −36 volts. Immediately after it has triggered this becomes a few hundred ohms in series with the condenser 48 and an open circuit voltage on the order of −18 volts. If this transition is to be used by applying a step, following a quiescent condition (as in some system duty cycles), to an A. C. coupled load, there is only one item of significance in the equivalent circuit before the step, namely its open circuit voltage. The important equivalent circuit is made up of the internal impedance after the step together with a voltage step of the difference of internal voltage before and after. A low internal impedance after the step corresponds to high available power. The present regenerative amplifier has excellent performance in this respect, with the available output energy being proportional to the capacity of the emitter condenser.

It has been mentioned that the internal output impedance immediately after the transition is of most interest for maximum pulse power output. This condition bears on the choice of whether an amplifier consisting of a triggerable monostable circuit should be normally "on" or normally "off," since it is desirable to have the transition that occurs upon triggering to have the largest step of open circuit output voltage and the lowest internal resistance following the transition. The present circuit fits these requirements well.

Perhaps the simplest amplifier delay circuit would use the transition at the end of the "on" time of a normally "off" triggerable circuit as the output, for example, the trailing edge of the output pulse produced by the regenerative amplifier when triggered. In the present illustrative circuit, however, a positive step is required to trigger the next succeeding register and the trailing edge of the output pulse of the regenerative amplifier 34 is of the wrong sense at the collector 40. Furthermore, the voltage step and the power output, the latter being a function largely of the internal impedance after the step, may not be all that is desired. It has also been found possible, by using principles of the present invention, to decrease the rise time of the desired transition.

In accordance with principles of the present invention, the stable sensitivity of the regenerative amplifier 34 just described is retained and its delayed negative step is employed to control a circuit which is generally of the type described in connection with Fig. 1, and which gives the desired delayed transition. The amplifier circuit 33 in Fig. 6 is a version of the circuit of Fig. 1 with input pulses being applied through a small series resistor 51 and a condenser 52 to the base electrode 53, and with output being taken across the emitter 54 and collector 55 electrodes. This circuit, as previously described, is normally "on" in the saturated region with approximately 9 milliamperes flowing in the emitter and collector circuit. A positive pulse from the regenerative amplifier turns this circuit "off" by making the base 53 more positive than the emitter 54, thereby reducing the emitter current to cut-off. The base electrode drifts negative, as the condenser 52 tends to charge towards negative voltage of the collector supply battery 56 and, as previously described, the circuit will return to the "on" condition when either the input trigger pulse is removed or when the emitter 54 to base 53 potential reaches the threshold value for positive emitter current to flow. During the "off" condition, the collector drifts negative along with the base, thereby emphasizing the positive transition when the circuit returns to the "on" condition and making available a large positive voltage step at the end of the desired delay. Output is taken through the coupling condenser 57.

A feature of the embodiment as just described is the low output impedance from collector 55 to emitter 54 when the circuit is in the saturated region (on). This enhances the power delivered by the circuit, since it is the "off" to "on" transition that is used to trigger the succeeding register, and as previously described, in certain systems, it is the internal impedance after the transition which is the most important in determining power output.

Another feature of the embodiment as just described is that the impedance looking into the collector and emitter circuit when the circuit is "on" has the characteristics of a constant voltage source, e. g., the more current delivered by the collector to the output, the lower will be the internal impedance looking into the circuit. This effect is not completely understood but may be due to conductivity modulation of the germanium as emitter current increases.

Since it is only the positive transition at the end of the delay that is desired in this case, the coupling networks shown in Fig. 5 are inserted between the amplifier delay circuits and the bit registers. The main function of these circuits is to transmit a positive step forward while blocking direct current. The series condenser 61 performs the necessary blocking function. Further, the negative step at the beginning of the delayed period must be permitted to leak off the condenser 61 before the positive step arrives so that the full magnitude of the transition is realized, i. e., so that the input voltage of the register 32 shall go positive with respect to its quiescent value. The shunt diode 62 dissipates this negative step. Further, it is desirable to prevent any spurious positive voltage at the beginning of the delay period from appearing at the set to "1" input when the register is storing a "1," since this would hinder the program pulse from setting the register to zero. Such positive pulses have been found to occur with some transistors and are due to slowness in switching off of the device.

This is prevented by the resistor 63 which is connected to the negative terminal of the battery 64 and which allows transmission of a positive step with no loss when the register 32 is storing a "0" and clips away the lower seven volts of a step when the register is storing a "1." The series diode 65 prevents transmission forward of the above-mentioned negative step and, with the negative bias supplied by the battery 64, shows a high resistance looking back from the register 32 so that a signal on the set to "0" input can set the register easily.

The series condenser 66 and resistor 67 between the bit register 31 output and the amplifier 33 input provide some alternating-current isolation so that changes in amplifier 33 input impedance upon triggering will not disturb the register 31 and also provide direct-current blocking.

Figure 7:
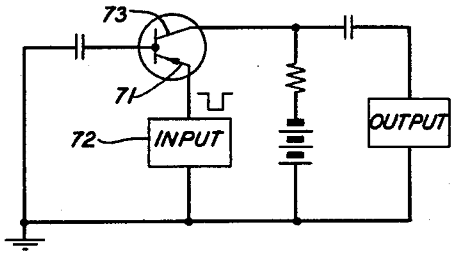
Fig. 7 illustrates another embodiment of the invention.

Another circuital arrangement embodying principles of the invention is illustrated in Fig. 7. In Fig. 7, input pulses are applied to the emitter 71, preferably from a low impedance source 72 so as to preserve the low output impedance across the emitter and collector electrodes when the circuit is in the saturated condition.

Although the invention has been described in relation to specific embodiments, it should be understood that these embodiments are intended to be illustrative rather than restrictive so that the invention should not be limited to the embodiments specifically described above. In particular, it should be understood that the invention is not limited to n-type point contact transistors but is equally applicable to other transistors displaying the phenomena of current amplification.

What is claimed is:

1. A transistor circuit comprising a transistor having an emitter electrode, a collector electrode, and a base electrode, and a current gain between two of said electrodes of greater than unity, a first circuit interconnecting one of said two electrodes and the third electrode, a second circuit interconnecting the other of said two electrodes and said third electrode, capacitive means connected in said first and second circuits to isolate said third electrode from said two electrodes for direct currents, a direct-current path interconnecting said two electrodes and including a source of direct current, control means to cut off the flow of current in said one of said two electrodes, and means to derive an output from the other of said two electrodes.

2. The combination according to claim 1, wherein said control means comprise means to reduce the flow of current in said one of said two electrodes to an intermediate value in the active operating region of said transistor.

3. A transistor circuit comprising a transistor having an emitter electrode, a collector electrode, and a base electrode, and a current gain of greater than unity, a first circuit interconnecting said base and emitter electrodes, a second circuit interconnecting said collector and base electrodes, said second circuit including a source of direct current, means to isolate said base electrode for steady currents from said emitter and collector electrodes which comprises capacitive means connected in series with said base electrode, means to reduce the current flow in said first circuit to cut-off, and means to derive an output from said collector electrode.

4. A transistor circuit comprising a current multiplication transistor having an emitter electrode, a collector electrode, and a base electrode, a first circuit interconnecting said base and emitter, a second circuit interconnecting said base and collector, capacitive means connected in said circuits to block the flow of direct current from said base electrode, a third circuit interconnecting said emitter and collector electrodes and including a source of direct current poled in the direction of normal current flow, in the active region of said transistor, in said emitter and collector electrodes, whereby said transistor is normally operating in the saturation region of its static operating characteristics, means to momentarily drive said transistor out of the said saturation region which comprise means to reduce the current flow in said emitter electrode to substantially zero, and means to derive an output from a circuit which includes said collector electrode.

5. The combination in accordance with claim 4, wherein said means to drive said transistor out of said saturation region comprise a source of pulses and means to apply said pulses to said base electrode.

6. The combination in accordance with claim 4, wherein said means to drive said transistor out of said saturation region comprise a source of pulses and means to apply said pulses to said emitter electrode.

7. The combination in accordance with claim 4, wherein said means to drive said transistor out of said saturation region comprise a source of stairstep waves and means to inject said waves in said first circuit.

8. The combination in accordance with claim 4, wherein said last-named means comprise means to derive an output from a circuit including said emitter and collector electrodes.

9. The combination in accordance with claim 4, wherein said means to momentarily drive said transistor out of the said saturation region comprises means to reduce the current flow in said emitter electrode to an intermediate value in the active region of said static operating characteristics.

10. A transistor circuit comprising a current multiplication transistor having an emitter electrode, a collector electrode, and a base electrode, an input circuit including a source of pulses connected in circuit with said base and emitter electrodes, an output circuit connected in circuit with said collector and emitter electrodes, a source of direct current connected in a circuit path which includes said collector and emitter electrodes, and means to isolate direct currents from said base electrode comprising capacitive means connected in series with said base electrode.

11. The combination in accordance with claim 10, wherein the polarity and voltage of said pulses are proper and sufficient to reduce the current flow in said emitter electrode to zero.

12. An amplifier delay circuit which comprises a current multiplication transistor having an emitter electrode, a collector electrode, and a base electrode, means to block the flow of direct current from said base electrode which comprise a capacitor connected in series with said base electrode and a source of direct current connected in circuit between said emitter and collector electrodes, a trigger circuit connected in circuit with said capacitor, base, and emitter, means to trigger said trigger circuit, and an output circuit connected in a circuit including said collector and emitter electrodes.

JAMES R. HARRIS.

No references cited.